United States Patent [19]

Sheng

[11] 4,017,747
[45] Apr. 12, 1977

[54] FIRST TIMING CIRCUIT CONTROLLED BY A SECOND TIMING CIRCUIT FOR GENERATING LONG TIMING INTERVALS

[75] Inventor: Abel Ching Nam Sheng, Westport, Conn.

[73] Assignee: RCA Corporation, New York, N.Y.

[22] Filed: Nov. 17, 1975

[21] Appl. No.: 632,814

[52] U.S. Cl. .................. 307/293; 307/246; 307/294; 328/129; 328/147; 307/360

[51] Int. Cl.² ............... H03K 5/13; H03K 17/26

[58] Field of Search ........... 307/235 N, 246, 293, 307/294; 328/129, 147, 55

[56] References Cited

UNITED STATES PATENTS

| | | | |
|---|---|---|---|
| 3,513,400 | 5/1970 | Russell | 328/147 |
| 3,582,678 | 6/1971 | Davis, Jr. et al. | 307/293 |
| 3,683,284 | 8/1972 | Mueller | 328/147 |
| 3,753,012 | 8/1973 | Frederiksen et al. | 307/293 |
| 3,808,466 | 4/1974 | Campbell | 307/293 |
| 3,873,853 | 3/1975 | Ahmed | 307/235 N |
| 3,887,823 | 6/1975 | Nikami | 307/293 |
| 3,889,197 | 6/1975 | Duff | 328/55 |
| 3,952,213 | 4/1976 | Fukaya | 328/55 |

*Primary Examiner*—Stanley D. Miller, Jr.
*Attorney, Agent, or Firm*—H. Christoffersen; S. Cohen; A. L. R. Limberg

[57] ABSTRACT

A timing circuit utilizing first and second hysteresis comparators. The first comparator senses the voltage across a capacitor in a first charging circuit. Whenever this voltage exceeds the high comparator reference level, the comparator output is at a first voltage level, permitting charging of the capacitor. When the capacitor voltage drops below the low comparator reference level, the comparator output switches to a second level, discharging the capacitor at a rate much faster than the charging rate. The second comparator interacts with a second capacitor in similar fashion; however, the second capacitor is permitted to charge only during the discharge periods of the first.

9 Claims, 1 Drawing Figure

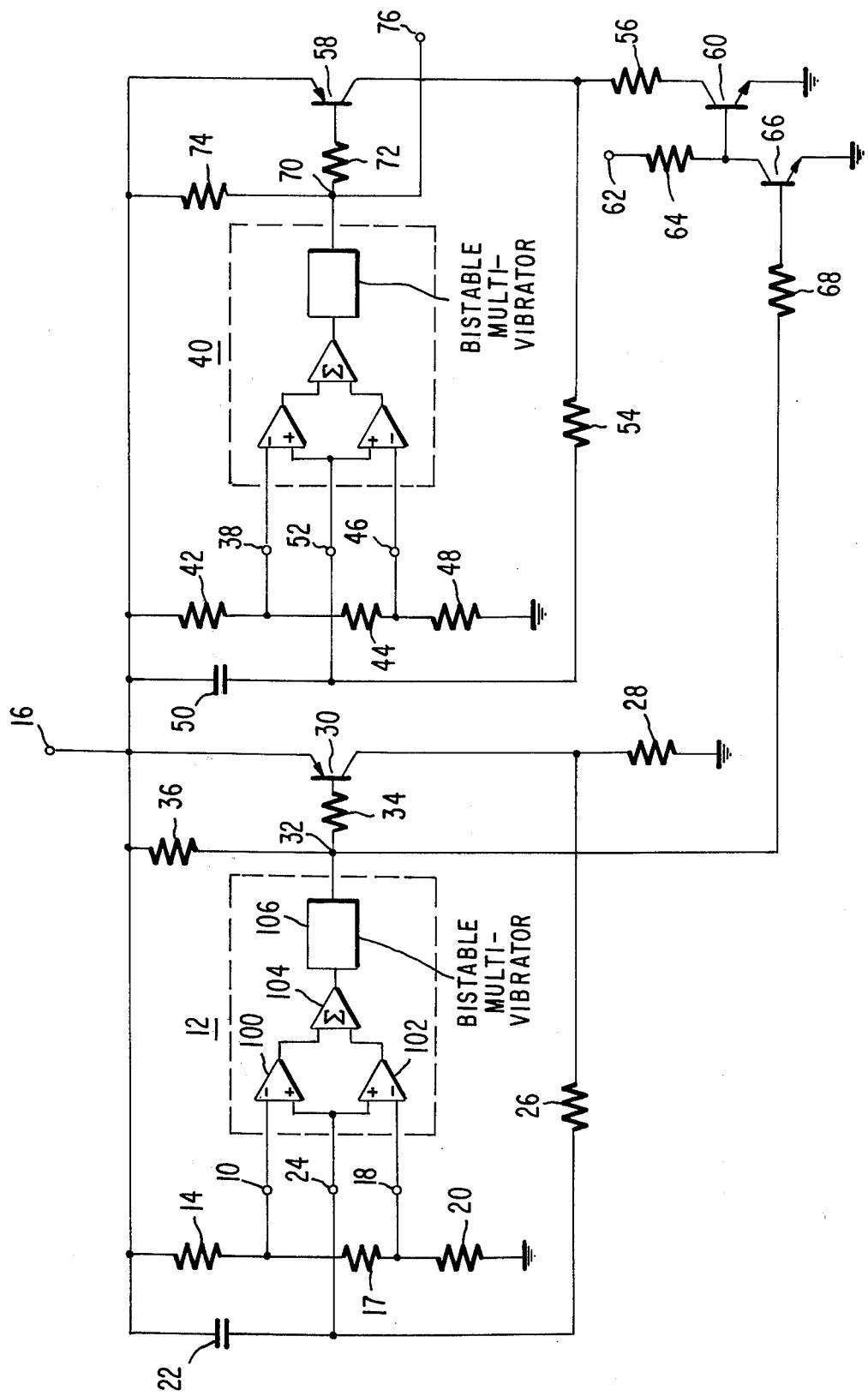

FIRST TIMING CIRCUIT CONTROLLED BY A SECOND TIMING CIRCUIT FOR GENERATING LONG TIMING INTERVALS

Long interval timing circuits using resistorcapacitor charging circuits often require very large capacitance values to achieve the desired timing functions. These capacitors must also have very low leakage currents and, as a result, are often quite expensive. In addition, the leakage current of the capacitors may vary as a function of temperature, resulting in significant timing errors.

An alternative technique for the generation of long time intervals is to periodically charge a timing capacitor by, for example, spaced pulses. If the pulses each have a duration which is some fraction $\eta$ of the pulse period, it will require a time $T/\eta$ for the capacitor to charge to some given voltage level, where T is the time required for the capacitor to charge to the same voltage level in response to a steady state voltage of the same amplitude. This reduces the size of capacitor required to achieve a given time delay.

Prior art timing circuits utilizing capacitors charged by periodically recurring pulses, while relatively low in cost, have several shortcomings. These circuits generally utilize at least one relaxation oscillator circuit. Such an oscillator may be realized using an active device such as a programmable unijunction transistor (PUT). The switching characteristics of such devices are quite temperature sensitive and this results in delays which are temperature dependent. In addition, the characteristics of the PUT vary from device-to-device and this means that each timing circuit must either have individually selected PUT's or factory adjustment of the circuits coupled to the PUT to compensate for its departures from the norm. In either case, the cost of the circuit is increased and, of course, this is highly undesirable, especially in mass production.

In the drawing:

The sole FIGURE is a schematic circuit diagram of a preferred embodiment of the invention.

In the FIGURE, the high voltage reference terminal 10 of hysteresis comparator 12 is connected through resistor 14 to terminal 16, which in turn is coupled to a source of operating potential (not shown). Terminal 10 is also connected through resistor 17 to the low voltage reference terminal 18 of comparator 12. Terminal 18 is also connected through resistor 20 to a source of reference potential, herein ground. Timing capacitor 22 is connected between terminal 16 and signal input terminal 24 of comparator 12. Terminal 24 is also connected through resistor 26 to the interconnection of resistor 28 and the collector of PNP transistor 30. The other end of resistor 28 is connected to the reference potential while the emitter of transistor 30 is connected to terminal 16. The output terminal 32 of comparator 12 is connected to the base of transistor 30 through resistor 34. Terminal 32 also connects to terminal 16 through resistor 36.

The high voltage reference terminal 38 of hysteresis comparator 40 is connected through resistor 42 to terminal 16 and through resistor 44 to the low voltage reference terminal 46. Terminal 46 is also connected through resistor 48 to the reference potential. Timing capacitor 50 is connected between terminal 16 and signal input terminal 52 of comparator 40. Terminal 52 is also connected through resistor 54 to the common connection of resistor 56 and the collector of PNP transistor 58. The emitter of transistor 58 is connected to terminal 16. The other end of resistor 56 is connected to the reference potential through the collector-emitter path of NPN transistor 60. The base of transistor 60 is connected through resistor 64 to terminal 62 which in turn is connected to a source of operating potential, which source may be the same as that applied to terminal 16. Also connected to the base of transistor 60 is the collector of NPN transistor 66. The emitter of this latter transistor is connected to the reference potential. The base of transistor 66 is connected through resistor 68 to output terminal 32 of comparator 12. Output terminal 70 of comparator 40 is connected to the base of transistor 58 through resistor 72 and to terminal 16 through resistor 74. Also connected to terminal 70 is circuit output terminal 76.

Hysteresis comparators 12 and 40 have the following characteristics. When the voltage present at the signal input terminal is greater than the voltage present at the high voltage reference terminal, the output of the comparator is at a first voltage level, herein a voltage at or near supply voltage level. The comparator output voltage remains at the first level until the signal input voltage drops below the voltage present at the low voltage reference input terminal. At this point, the comparator output drops to a second voltage level, herein a voltage at or near the reference voltage level. The output voltage of the comparator remains at this second level until the voltage at the signal input terminal once more rises above the voltage present at the high voltage reference terminal. At this time the output voltage rises to the first voltage level. It should be noted that during the time that the signal input voltage amplitude is between the values of the high and low reference voltates, the comparator output remains at its previous value.

Comparator circuits having the above-described properties are commercially available in integrated circuit form. For example, the CA 3098 manufactured by RCA Corporation has the above-described properties. A partial schematic diagram of this device is shown within blocks 12 and 40. Looking at block 12, which is functionally identical to block 40, voltage comparator 100 is connected at its inverting input terminal to a high reference voltage while the inverting input terminal of comparator 102 is connected to a low reference voltage. The input signal is applied to the remaining input terminals of both comparators. The outputs of the two comparators are applied via summing circuit 104 to the SET/RESET input of flip-flop 106.

When the input signal amplitude is equal to or greater than the high reference voltage, the outputs of both comparators are high. This results in a "set" signal being applied to the flip-flop 106 which causes its output to assume a first binary level. When the input signal is equal to or less than the low reference voltage, both comparator outputs are low, thereby applying a "reset"- 'signal to the flip-flop which switches its output to the other binary state. A signal voltage between the high and low reference voltage amplitudes caused the output of comparator 100 to be low and comparator 102 to be high. The flip-flop triggering characteristics are such that it does not respond to this voltage condition and, as a result, the output of the flip-flop remains at its previous state It is in this manner that the desired memory, or hysteresis, function is obtained. It should be appreciated that the circuit shown within block 12 is merely illustrative of one having the desired terminal characteristics and should not be construed as the sole embodiment of a hysteresis, comparator.

In the operation of the circuit of the FIGURE, when power is first applied to the circuit, the voltage instantaneously present across capacitors 22 and 50 is zero or close to it and terminals 24 and 52 instantaneously assume the potential present at terminal 16. Resistors 14, 17 and 20 form a voltage divider and supply the desired reference voltages to terminals 10 and 18 of comparator 12. In a similar manner, resistors 42, 44 and 48 supply reference voltages to terminals 38 and 46 of comparator 40. Because the voltage at terminal 24 initially is higher than the high reference voltage present at terminal 10, the output of comparator 12 is at its first voltage level, relatively positive, and transistor 30 is cut off. Output terminal 70 of comparator 40 is also at a relatively positive potential so that transistor 58 also is cut off. The positive potential at terminal 32 is coupled to transistor 66 through resistor 68 and turns on transistor 66. This drives the base of transistor 60 towards the reference potential, turning transistor 60 off. As transistors 60 and 58 are off, the charging and discharging paths for capacitor 50 are open and, as a result, terminal 52 remains at the supply voltage potential.

Capacitor 22 begins to charge through a path including resistors 26 and 28. As this capacitor charges, the voltage at terminal 24 decreases towards the reference potential. When the voltage at terminal 24 reaches a value equal to or less than the voltage present at terminal 18, the comparator 12 changes state, its output switching from it first (high) level to its second level, the latter at or near the reference potential. When the voltage at terminal 32 switches to this low value, transistor 30 turns on. This provides a discharge path for capacitor 22 through resistor 26 and the collector-emitter path of transistor 30 to the operating potential present at terminal 16. Thus, capacitor 22 is charged through a path comprising resistors 26 and 28 and discharged through a path comprising resistor 26 and the collector-to-emitter path of transistor 30. This latter impedance is negligible compared to the impedance of resistor 26. The voltage at terminal 32 remains relatively low until the capacitor 22 is discharged to a point where the voltage at terminal 24 is once again equal to or greater than the voltage at terminal 10. At this time, the state of the comparator will change and the voltage at terminal 32 will rise to its first level, causing the above-described timing charge and discharge cycle to repeat.

As mentioned earlier, during the first period that the voltage at terminal 32 is relatively high, there is no charging or discharging of capacitor 50, terminal 52 is at a high level and the output voltage of comparator 40 is at its first, relatively positive, level. When the voltage at terminal 32 drops to its second or low level, transistor 66 turns off, which in turn turns on transistor 60. As a result, capacitor 50 begins to charge through the path comprising resistor 54, resistor 56 and the collector-emitter path of transistor 60. The charging continues till terminal 32 switches back to its first (high) level. This opens the charging path (transistor 60 turns off); however the capacitor 50 is only charged a relatively small amount, and though the voltage at point 50 is lowered, it isn't lowered to a value equal to or lower than that at terminal 46. Thus, comparator 40 remains in its original state, with its output terminal 70 in its first (high) state.

The process above continues, capacitor 50 receiving an additional charge during each interval that the voltage at terminal 32 is low. The input impedance of comparator 40 is sufficiently high to prevent any appreciable discharge of capacitor 50 between charging intervals.

After some number M of periods of the wave at 32 (M depending on the circuit design parameters as discussed in brief later), the voltage at terminal 52 of comparator 40 decreases to the point where it is equal to or less than the voltage present at terminal 46. The output voltage of comparator 40 now drops from its first to its second (low) level. This turns on transistor 58 and provides a discharge path for capacitor 50. Capacitor 50 discharges through resistor 54 and the collector-to-emitter path of transistor 58. The latter's impedance is negligible compared to that of resistor 54 (and similarly the collector-emitter impedance of transistor 60 is negligible compared to the impedance of resistor 56). The discharge continues until the potential at terminal 52 is once more equal to or greater than the voltage present at terminal 38. When this point is reached, the voltage at output terminal 70 returns once more to a high value and the periodic charging of capacitor 50, each time 32 goes low, again begins.

If the value of resistor 28 is very much greater than that of resistor 26, the discharge period of capacitor 22 is very much less than its charge period. As a result, the duty cycle $\eta$ of the negative-going pulse train present at terminal 32 is very small. This, in turn, means that it takes a very long time to charge capacitor 50 to a given voltage level compared to the time required if a steady state voltage having the same amplitude as the pulse train is used for the charging voltage. The effective size of capacitor 50 has therefore been increased by a factor $1/\eta$, where $\eta$ may be very small.

By way of example, in a particular embodiment, resistors 14, 17, 42 and 44 may each have a value of 1 megohm while resistors 20 and 48 may each have a value of 2 megohms. For these resistance values, the high reference voltage for each comparator is $3V_{16}/4$, while the low reference voltage is $V_{16}/2$, where $V_{16}$ is the value of the voltage applied to terminal 16.

For the above reference voltage ratios, the time $t_1$ during each period of operation that the output voltage of comparator 12 is at its first level is $t_1 = 0.406 \ (R_{26} + R_{28}) \ C_{22}$, while the time $t_2$ during which the comparator is at its second level is $0.693 \ (R_{26}) \ C_{22}$. The duty cycle $\eta = t_2/(t_1 + t_2) = 0.693 \ R_{26}/0.406 \ (R_{26} + R_{28})$, for the condition that $R_{28} >> R_{26}$.

Since capacitor 50 is only charged during the interval when the output of comparator 12 is at its second level, the output of comparator 40 is at its first level for a time $t_3$ during each period of operation $t_3 = 0.406 \ (R_{54} + R_{56}) \ C_{50}/\eta$. The time $t_4$ that the output of comparator 40 is at its second level is $_4 = 0.693 \ (R_{54}) \ C_{50}$. Where $R_{28} = 170 \ R_{26}$, $\eta = 0.01$ and $T_3 = 0.406 \ (R_{54} + R_{56}) \ C_{50}/0.01$. Thus, the required value of capacitor 50 to realize a particular time delay $t_3$ is reduced by a factor of 100 compared to the steady state charging situation.

The circuit herein disclosed has repeatable characteristics even when assembled from components that have not been selected for any particular electrical characteristic. When comparators 12 and 40 are biased at particular reference voltage levels, the desired output pulse period may be achieved via the simple calculation of component values for no more than six elements: capacitors 22 and 50 and resistors 26, 28, 54 and 56.

What is claimed is:

1. A timing circuit comprising, in combination:
   first and second charge store means;
   first and second comparators, each of the type having two reference voltage input levels, one relatively high and the other relatively low, and a signal voltage input terminal, and each for producing an output signal at a first level when the input signal present at said input terminal is higher than said high reference level, for producing an output signal at a second level when said input signal is lower than said low reference level, and for producing an output signal which remains at its previous value, either first or second, when said input signal is between said high and low levels, said first comparator connected at its signal input terminal to one terminal of said first charge storage means for sensing the voltage present there and said second comparator connected at its signal input terminal to one terminal of said second charge storage means for sensing the voltage present there;
   means responsive to the output signal of said first comparator for charging said first charge storage means when said output signal is at one level and discharging the same when said output signal is at its other level; and
   means for charging the second charge storage means, during the time said first charge storage means is discharging, when the output of said second comparator is at one level, and responsive to the output signal of said second comparator when at its other level, for discharging said second charge storage means.

2. A timing circuit as set forth in claim 1, wherein said means for charging said first charge storage means comprises two terminals across which an operating voltage may be applied and resistive means connected in series with said first charge storage means between said terminals, and wherein said means for discharging said first charge storage means comprising a normally open switch coupled across said first charge storage means and means responsive to said output signal of said first comparator when said signal is at its other level for closing said switch.

3. A timing circuit as set forth in claim 2 wherein said means for charging said first charge storage means has a substantially longer time constant than said means for discharging the same.

4. A timing circuit as set forth in claim 1 wherein said means for charging said second charge storage means comprises two terminals across which an operating voltage may be applied, a normally open switch and resistive means, said normally open switch and said resistive means being connected in series with said second charge storage means between said two terminals and means responsive to the output of said first comparator when said output is at said one level for closing said switch, and wherein said means for discharging said second charge storage means comprises a second normally open switch, this one coupled across said second charge storage means, and means for closing said second switch in response to the output of said second comparator, when said output is at its second level.

5. A timing circuit as set forth in claim 4, wherein said means for charging said first charge storage means comprises second resistive means, said second resistive means connected in series with said first charge storage means between said terminals, and wherein said means for discharging said first charge storage means comprising a third normally open switch coupled across said first charge storage means and means responsive to said output signal of said first comparator when said signal is at its other level for closing said third switch.

6. A timing circuit as set forth in claim 5 wherein each of said charge storage means comprises a capacitor.

7. A timing circuit as set forth in claim 5 wherein each means for charging a charge storage means has a substantially longer time constant than the means for discharging the same charge storage means.

8. A timing circuit comprising, in combination:
   first charge storage means;
   a comparator of the type having two reference voltage input levels, one relatively high and other relatively low, and a signal input terminal, for producing an output signal at a first level when the input signal present at said input terminal is higher than said high reference level, for producing an output signal at a second level when said input signal is lower than said low reference level, and for producing an output signal which remains at its previous value, either first or second, when said input signal is between said high and low levels, said comparator connected at its signal input terminal to one terminal of said charge storage means for sensing the voltage present there;
   a charging circuit connected across said first charge storage means for charging said first charge storage means when the output of said comparator is at one level;
   a discharging circuit having a substantially shorter time constant than said charging circuit, coupled across first charge storage means and responsive to the output of said comparator, when at its other level, for discharging said first charge storage means;
   a second charge storage means;
   means responsive to the output of said comparator for charging said second charge storage means only during each period said first charge storage means discharges; and
   means responsive to the voltage across said second charge storage means for discharging the same each time said second charge storage means charges to a predetermined level, said predetermined level being substantially larger than the charge accumulated by said second charge storage means during one period of discharge of said first charge storage means.

9. In combination:
   means for producing a train of pulses of relatively short duration compared to the pulse period;
   capacitance means;
   means responsive to each pulse for charging said capacitance means during the pulse interval;
   a comparator connected across said capacitance means for sensing the voltage across the same, said comparator being of the type which produces an output voltage at a first level when the voltage across the capacitance means is lower than a given first value, which produces an output voltage at a second level when the voltage across the capacitance means is greater than a given second value higher than the first, and which produces an output voltage at its previous level when the voltage across said capacitance means is between said first and second levels; and means responsive to the output of said comparator for discharging said capacitance means when the output of said comparator is at its second level.

* * * * *

UNITED STATES PATENT OFFICE
CERTIFICATE OF CORRECTION

PATENT NO. : 4,017,747

DATED : April 12, 1977

INVENTOR(S) : Abel Ching Nam Sheng

It is certified that error appears in the above-identified patent and that said Letters Patent are hereby corrected as shown below:

Title Sheet, after "[21] Appl. No.: 632,814" insert
-- [30] Foreign Applications Priority Data
Aug. 18, 1975   United Kingdom....34236/75" --

Column 2, lines 58-59, "reset'-'signal" should read -- reset --.
Column 2, line 61, change "caused" to -- causes --.
Column 2, line 66, after "state" insert a period.
Column 4, line 58, change "$._4$" to -- $t_4$ --.
Column 6, line 40, before "first" insert -- said --.

Signed and Sealed this twenty-third Day of August 1977

[SEAL]

Attest:

RUTH C. MASON
Attesting Officer

C. MARSHALL DANN
Commissioner of Patents and Trademarks